United States Patent
Miura et al.

(10) Patent No.: US 11,201,614 B2
(45) Date of Patent: Dec. 14, 2021

(54) LOAD CONTROL DEVICE HAVING MULTIPLE TERMINALS AND A CLAMP CIRCUIT CONNECTED THEREBETWEEN

(71) Applicant: Hitachi Automotive Systems, Ltd., Hitachinaka (JP)

(72) Inventors: Hikaru Miura, Hitachinaka (JP); Akihiro Machida, Hitachinaka (JP); Mutsumi Kikuchi, Hitachinaka (JP); Tatsumi Yamauchi, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 10 days.

(21) Appl. No.: 16/629,603

(22) PCT Filed: Jun. 13, 2018

(86) PCT No.: PCT/JP2018/022512
§ 371 (c)(1),
(2) Date: Jan. 9, 2020

(87) PCT Pub. No.: WO2019/017119
PCT Pub. Date: Jan. 24, 2019

(65) Prior Publication Data
US 2021/0091763 A1 Mar. 25, 2021

(30) Foreign Application Priority Data

Jul. 19, 2017 (JP) .............................. JP2017-140255

(51) Int. Cl.
*H02H 9/04* (2006.01)
*H03K 17/73* (2006.01)
(Continued)

(52) U.S. Cl.
CPC ... *H03K 17/08142* (2013.01); *G01R 31/3842* (2019.01); *H02H 9/047* (2013.01);
(Continued)

(58) Field of Classification Search
CPC ........ H02H 9/047; H02H 3/24; H03K 17/731; H03K 17/08142; H02M 7/537
See application file for complete search history.

(56) References Cited

U.S. PATENT DOCUMENTS 5,465,190 A * 11/1995 Meunier ................ H02H 3/025
361/111
9,647,466 B2 * 5/2017 Kubo .................... H02J 7/0029
(Continued)

FOREIGN PATENT DOCUMENTS

JP 3-101518 A 4/1991
JP 2000-184582 A 6/2000
(Continued)

OTHER PUBLICATIONS

JP2000269029A English Machine Translation, Abe Tetsuo, Inductive Load Drive Circuit, (Year: 2000).*
(Continued)

*Primary Examiner* — Sisay G Tiku
(74) *Attorney, Agent, or Firm* — Crowell & Moring LLP

(57) ABSTRACT

Disconnection of a circulation path through which a circulation current flows is detected while suppressing an increase in circuit scale. A battery monitoring device includes switching circuits that control currents flowing through coils of main contactors by being controlled to be turned on and off, freewheeling diodes that are connected to the coils of the main contactors to form circulation paths for circulating the currents, and a control unit. The control unit measures output voltages of the freewheeling diodes at an input terminal, and detects the disconnection of the circulation paths based on the output voltages of the freewheeling diodes.

6 Claims, 4 Drawing Sheets

(51) Int. Cl.
*H03K 17/0814* (2006.01)
*H02M 7/537* (2006.01)
*G01R 31/3842* (2019.01)
*H02M 1/00* (2006.01)

(52) U.S. Cl.
CPC ............ *H02M 1/00* (2013.01); *H02M 7/537* (2013.01); *H03K 17/731* (2013.01); *H02M 1/0003* (2021.05)

(56) References Cited

U.S. PATENT DOCUMENTS

| | | | | |
|---|---|---|---|---|
| 9,897,662 | B2* | 2/2018 | Miura | H01M 10/482 |
| 10,187,049 | B2* | 1/2019 | Iwamizu | H03K 17/081 |
| 10,788,539 | B2* | 9/2020 | Miura | H02J 7/0029 |
| 2008/0316666 | A1* | 12/2008 | Tamagawa | F02D 41/20 361/92 |
| 2012/0319499 | A1* | 12/2012 | Ooishi | H02M 3/156 307/104 |
| 2017/0302260 | A1* | 10/2017 | Iwamizu | H03K 17/081 |
| 2018/0047535 | A1* | 2/2018 | Sugisawa | H01H 47/02 |
| 2020/0212664 | A1* | 7/2020 | Takuma | H03K 17/145 |
| 2020/0287538 | A1* | 9/2020 | Kohama | H03K 17/731 |

FOREIGN PATENT DOCUMENTS

| | | | |
|---|---|---|---|
| JP | 2000184582 | A * | 6/2000 |
| JP | 2000-269029 | A | 9/2000 |
| JP | 2000269029 | A * | 9/2000 |
| JP | 2009-4979 | A | 1/2009 |
| JP | 2012-109659 | A | 6/2012 |

OTHER PUBLICATIONS

JP2000184582A English Machine Translation, Kondo Koichi, Solenoid Driver, (Year: 2000).*
International Search Report (PCT/ISA/210) issued in PCT Application No. PCT/JP2018/022512 dated Aug. 28, 2018 with English translation (four pages).
Japanese-language Written Opinion (PCT/ISA/237) issued in PCT Application No. PCT/JP2018/022512 dated Aug. 28, 2018 (four pages).

* cited by examiner

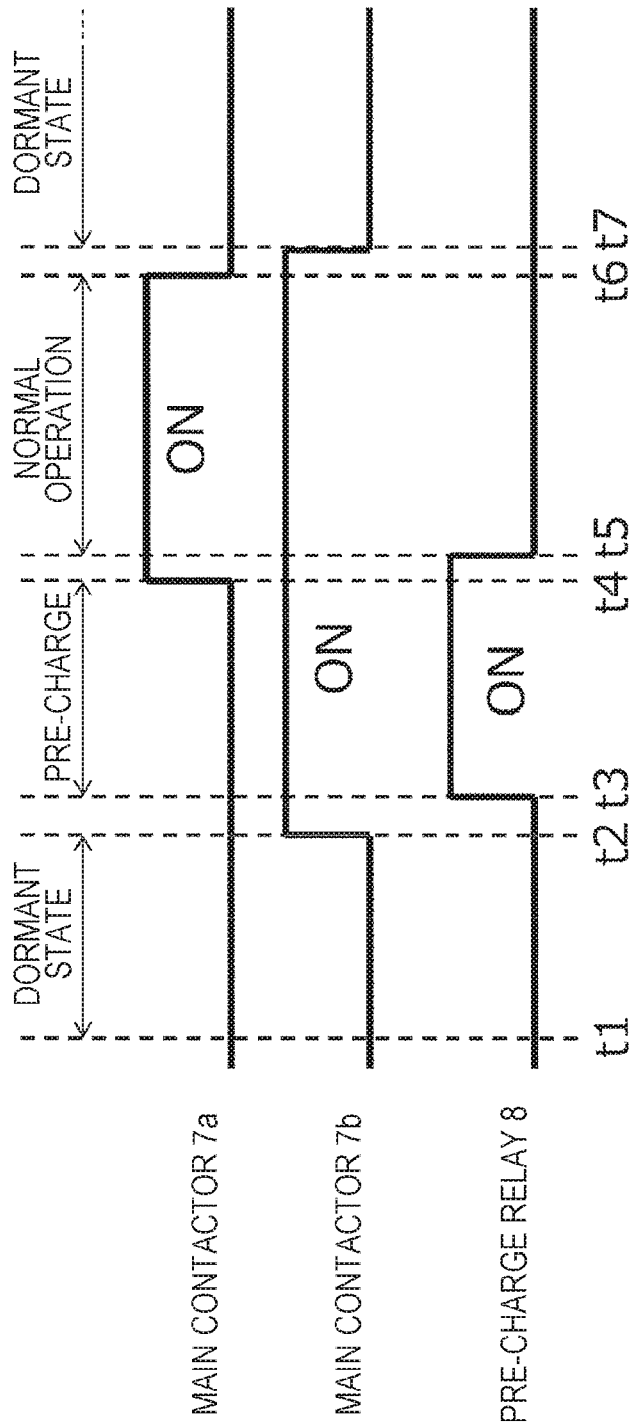

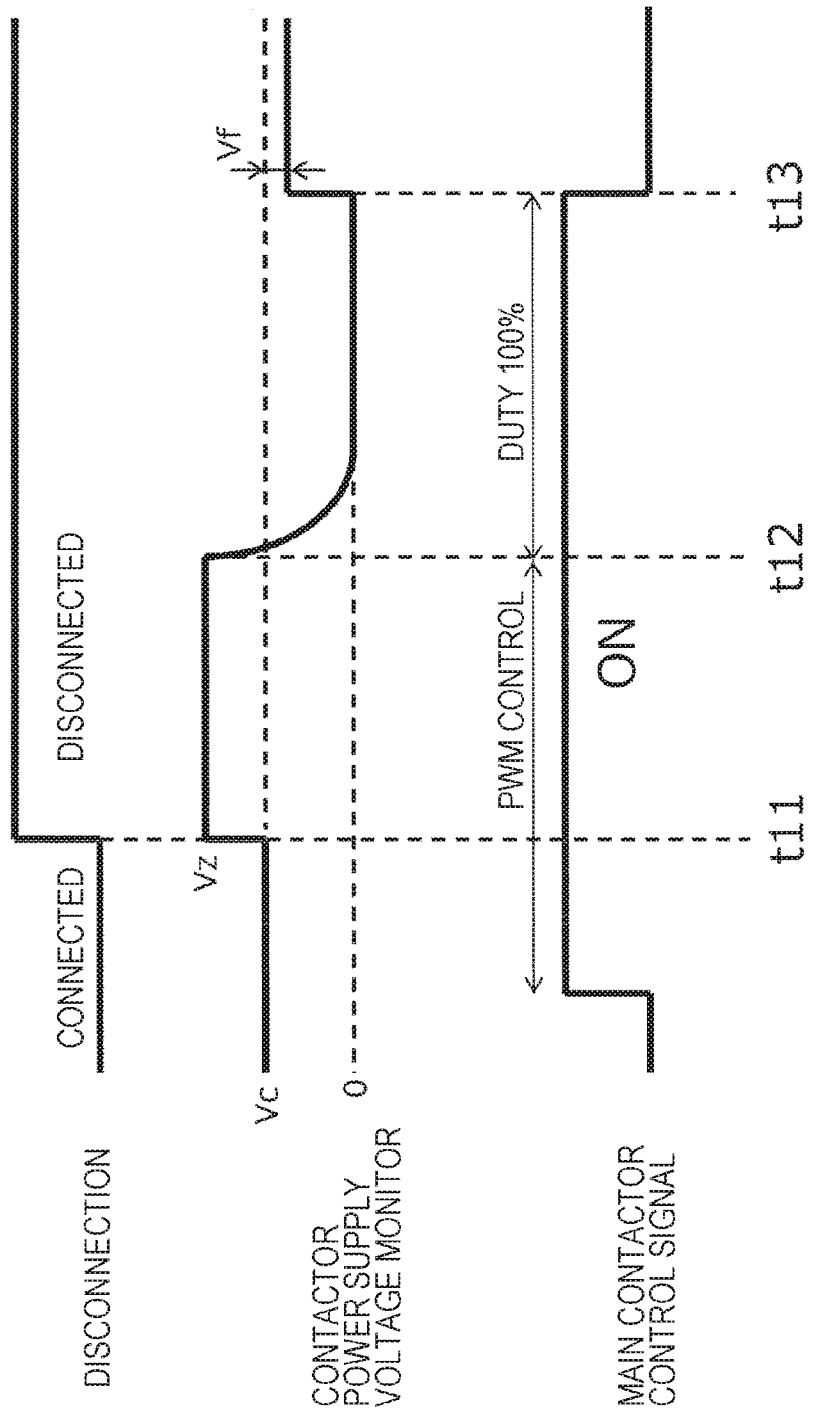

LOAD CONTROL DEVICE HAVING MULTIPLE TERMINALS AND A CLAMP CIRCUIT CONNECTED THEREBETWEEN

TECHNICAL FIELD

The present invention relates to a load control device that controls an inductive load.

BACKGROUND ART

There is known a technique for monitoring a state of a circulation path through which a circulation current flows when an inductive load using a coil is controlled to be driven. PTL 1 discloses an inductive load drive circuit that includes a freewheeling diode which is connected in parallel to an inductive load to form a circulation line, a drive terminal voltage monitor circuit which has a peak-hold function of detecting a terminal voltage of the inductive load drive terminal, and a failure detection circuit which detects an open-circuit failure of the circulation line from an output value of the drive terminal voltage monitor circuit.

CITATION LIST

Patent Literature

PTL 1: JP 2000-269029 A

SUMMARY OF INVENTION

Technical Problem

In the inductive load drive circuit described in PTL 1, since the drive terminal voltage monitor circuit having the peak-hold function is required, a circuit scale increases. In particular, when a plurality of inductive loads is controlled to be driven, such a drive terminal voltage monitor circuit is required for each inductive load, thereby causing an increase in size and cost of a device.

Solution to Problem

A load control device according to the present invention includes a switching circuit that controls a current flowing through an inductive load by being controlled to be turned on and off, a freewheeling diode that is connected to the load to form a circulation path for circulating the current, a first voltage measurement unit that measures an output voltage of the freewheeling diode, and a control unit that detects disconnection of the circulation path based on the output voltage of the freewheeling diode measured by the first voltage measurement unit.

Advantageous Effects of Invention

According to the present invention, it is possible to detect disconnection of a circulation path through which a circulation current flows while suppressing an increase in circuit scale.

BRIEF DESCRIPTION OF DRAWINGS

FIG. 3 is a diagram illustrating an example of a contactor control sequence.

FIG. 4 is a diagram illustrating an example of a detection voltage and a drive signal when disconnection of a circulation path occurs.

DESCRIPTION OF EMBODIMENTS

Figure 1:
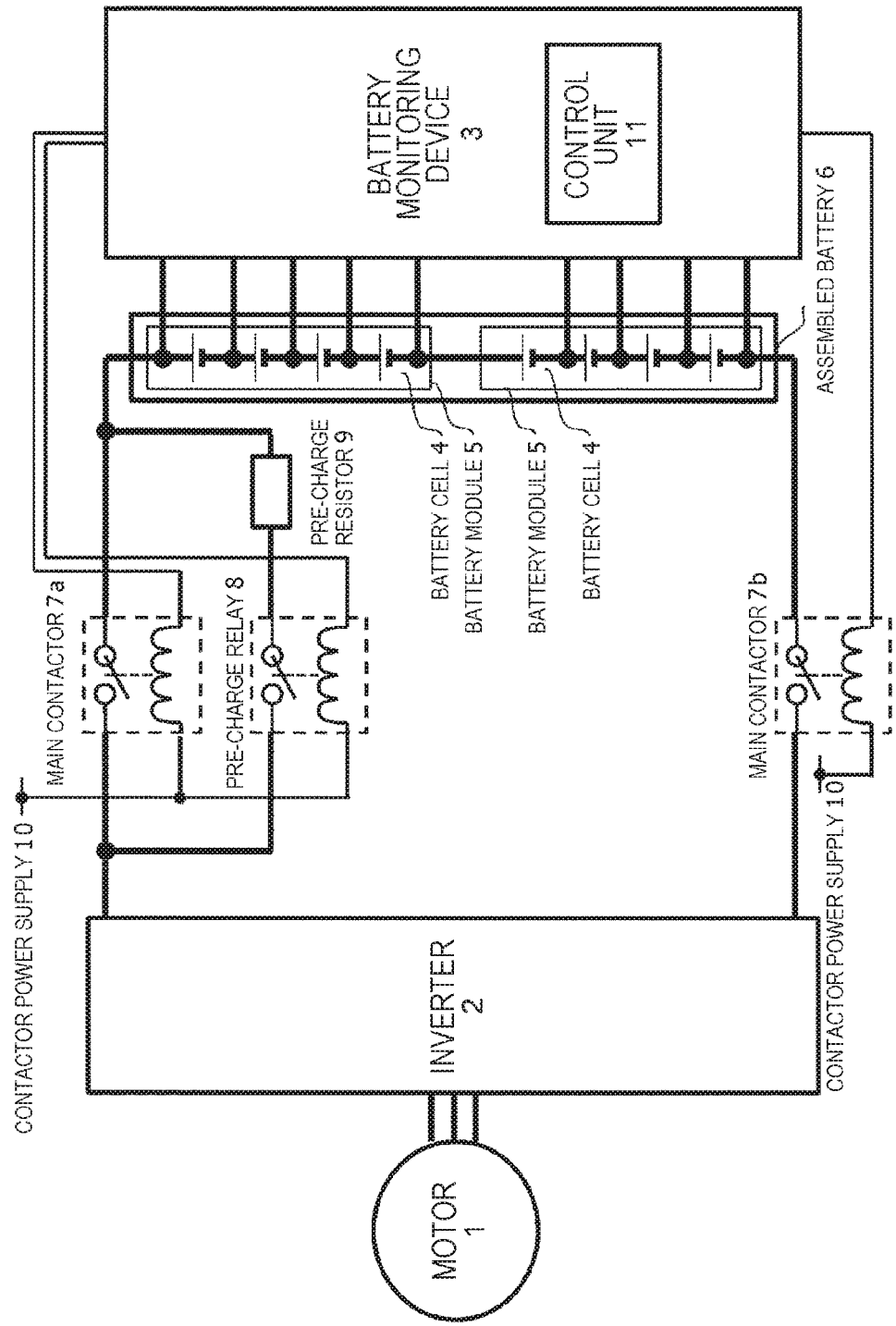
FIG. 1 is a diagram illustrating a configuration of a battery drive system to which a load control method according to an embodiment of the present invention is applied.

Hereinafter, an embodiment of the present invention will be described with reference to FIG. 1. FIG. 1 is a diagram illustrating a configuration of a battery drive system to which a load control method according to an embodiment of the present invention is applied. The battery drive system illustrated in FIG. 1 includes a motor 1, an inverter 2, a battery monitoring device 3, and an assembled battery 6.

The inverter 2 converts a DC power supplied from the assembled battery 6 into an AC power, and outputs the converted AC power to the motor 1. The motor 1 is rotationally driven by using the AC power output from the inverter 2, and generates a driving force. That is, the motor 1 and the inverter 2 are operating systems that operate by using the AC power supplied from the assembled battery 6, and act as loads on the assembled battery 6. The assembled battery 6 can be charged by converting the AC power obtained by regenerative power generation of the motor 1 into the DC power by the inverter 2 and outputting the converted DC power to the assembled battery 6.

The assembled battery 6 includes a plurality of battery modules 5. Each battery module 5 includes a plurality of battery cells 4 connected in series. The assembled battery 6 is connected to the inverter 2 via main contactors 7a and 7b and a pre-charge relay 8.

The battery monitoring device 3 monitors a state of each battery cell 4 constituting the assembled battery 6, and performs switching control of the main contactors 7a and 7b and the pre-charge relay 8. That is, the battery monitoring device 3 has a function (load control function) of a load control device that controls each coil of the main contactors 7a and 7b and the pre-charge relay 8 which are inductive loads in addition to a battery monitoring function for monitoring the assembled battery 6. The main contactors 7a and 7b and the pre-charge relay 8 are connected to contactor power supplies 10, and coils acting as inductive loads on the contactor power supplies 10 are provided, respectively. The battery monitoring device 3 can control a magnetic field generated by each coil by controlling a current flowing through each coil, and can control switching states of the main contactors 7a and 7b and the pre-charge relay 8.

When the assembled battery 6 is connected to the inverter 2 in the battery drive system, the battery monitoring device 3 limits an inrush current flowing at the time of the connection by the pre-charge resistor 9 by initially switching the pre-charge relay 8 and the main contactor 7b from off to on. Thereafter, when a predetermined time has elapsed, the main contactor 7a is switched from off to on, and the pre-charge relay 8 is switched from on to off. Thus, when the power is supplied from the assembled battery 6 to the inverter 2, unnecessary power consumption is avoided due to the pre-charge resistor 9.

A control unit 11 constituted by a microcomputer and FPGA is provided in the battery monitoring device 3. The control unit 11 executes various processes and calculations necessary for monitoring the assembled battery 6 and controlling each coil.

Figure 2:
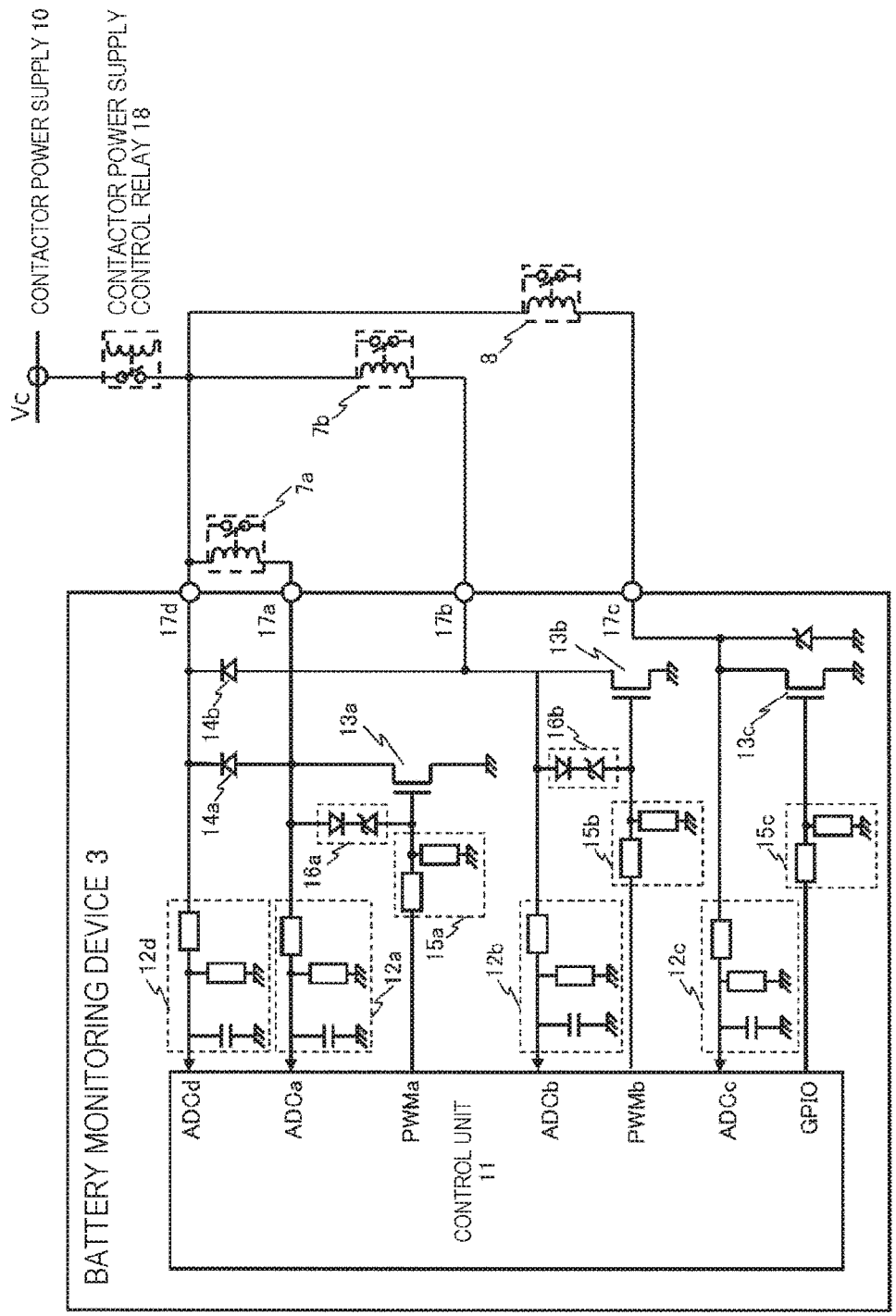
FIG. 2 is a diagram illustrating a circuit configuration example of a battery monitoring device related to a load control function.

Next, the function of the battery monitoring device 3 as the load control device will be described. FIG. 2 is a diagram illustrating a circuit configuration example of the battery monitoring device 3 related to the load control function. As illustrated in FIG. 2, in addition to the control unit 11, the battery monitoring device 3 includes, for example, monitor circuits 12a, 12b, 12c, and 12d, switching circuits 13a, 13b, and 13c, freewheeling diodes 14a and 14b, input circuits 15a, 15b, and 15c, and clamp circuits 16a and 16b.

Connector terminals 17a, 17b, 17c, and 17d are provided in the battery monitoring device 3. One terminal of the coil of each of the main contactors 7a and 7b and the pre-charge relay 8 is connected to the connector terminal 17d of the battery monitoring device 3, and is connected to the contactor power supply 10 via the contactor power supply control relay 18. The other terminal of the coil of the main contactor 7a is connected to the connector terminal 17a. The other terminal of the coil of the main contactor 7b is connected to the connector terminal 17b. The other terminal of the coil of the pre-charge relay 8 is connected to the connector terminal 17c.

The monitor circuit 12a is a circuit for measuring a terminal voltage of the coil of the main contactor 7a (terminal voltage which is not connected to the contactor power supply 10). A voltage corresponding to the terminal voltage of the coil of the main contactor 7a is input to an input terminal ADCa of the control unit 11 via the monitor circuit 12a. The control unit 11 performs AD conversion on the voltage input to the input terminal ADCa, and measures the terminal voltage of the coil of the main contactor 7a based on this voltage value.

The monitor circuit 12b is a circuit for measuring a terminal voltage of the coil of the main contactor 7b (terminal voltage which is not connected to the contactor power supply 10). A voltage corresponding to the terminal voltage of the coil of the main contactor 7b is input to an input terminal ADCb of the control unit 11 via the monitor circuit 12b. The control unit 11 performs AD conversion on the voltage input to the input terminal ADCb, and measures the terminal voltage of the coil of the main contactor 7b based on this voltage value.

The monitor circuit 12c is a circuit for measuring a terminal voltage of the coil of the pre-charge relay 8 (terminal voltage which is not connected to the contactor power supply 10). A voltage corresponding to the terminal voltage of the coil of the pre-charge relay 8 is input to an input terminal ADCc of the control unit 11 via the monitor circuit 12c. The control unit 11 performs AD conversion on the voltage input to the input terminal ADCc, and measures the terminal voltage of the coil of the pre-charge relay 8 based on this voltage value.

The monitor circuit 12d is a circuit for measuring output voltages (cathode terminal voltages) of the freewheeling diodes 14a and 14b. The outputs of the freewheeling diodes 14a and 14b are electrically connected to each other at a predetermined connection point. This connection point is connected to the input terminal ADCd of the control unit 11 via the monitor circuit 12d, and voltages corresponding to the output voltages of the freewheeling diodes 14a and 14b are input. The control unit 11 performs AD conversion on the voltages input to the input terminal ADCd, and measures the output voltages of the freewheeling diodes 14a and 14b based on this voltage values.

The switching circuit 13a controls the current flowing through the coil of the main contactor 7a by being controlled to be turned on and off by the control unit 11. The switching circuit 13a is constituted by, for example, an n-type MOSFET. A gate terminal thereof is connected to an output terminal PWMa of the control unit 11 via the input circuit 15a, and a drain terminal is connected to the coil of the main contactor 7a via the connector terminal 17a.

The switching circuit 13b controls a current flowing through the coil of the main contactor 7b by being controlled to be turned on and off by the control unit 11. The switching circuit 13b is constituted by, for example, an n-type MOSFET. A gate terminal thereof is connected to an output terminal PWMb of the control unit 11 via the input circuit 15b, and a drain terminal is connected to the coil of the main contactor 7b via the connector terminal 17b.

The switching circuit 13c controls a current flowing through the coil of the pre-charge relay 8 by being controlled to be turned on and off by the control unit 11. The switching circuit 13c is constituted by, for example, an n-type MOSFET. A gate terminal thereof is connected to an output terminal GPIO of the control unit 11 via the input circuit 15c, and a drain terminal is connected to the coil of the pre-charge relay 8 via the connector terminal 17c.

The freewheeling diode 14a is connected to both ends of the coil of the main contactor 7a via the connector terminals 17a and 17d to form a circulation path for circulating the current flowing through the coil of the main contactor 7a. That is, when the switching circuit 13a is switched from on to off, the current flowing through the coil of the main contactor 7a is circulated via the freewheeling diode 14a. In the battery monitoring device 3, the drain terminal of the switching circuit 13a, the clamp circuit 16a, and the monitor circuit 12a are connected to an input side (anode terminal side) of the freewheeling diode 14a. The monitor circuit 12d is connected to an output side (cathode terminal side) of the freewheeling diode 14a.

The freewheeling diode 14b is connected to both ends of the coil of the main contactor 7b via the connector terminals 17b and 17d to form a circulation path for circulating the current flowing through the coil of the main contactor 7b. That is, when the switching circuit 13b is switched from on to off, the current flowing through the coil of the main contactor 7b is circulated through the freewheeling diode 14b. In the battery monitoring device 3, the drain terminal of the switching circuit 13b, the clamp circuit 16b, and the monitor circuit 12b are connected to an input side (anode terminal side) of the freewheeling diode 14b. The monitor circuit 12d is connected to an output side (cathode terminal side) of the freewheeling diode 14b.

The clamp circuit 16a is a circuit that includes a diode and a Zener diode connected in series, and is connected between the gate terminal and the drain terminal of the switching circuit 13a. When the circulation path formed by the coil of the main contactor 7a and the freewheeling diode 14a is disconnected, the clamp circuit 16a clamps the voltage applied to the switching circuit 13a from the coil of the main contactor 7a to a predetermined clamp voltage Vz or less.

The clamp circuit 16b is a circuit that includes a diode and a Zener diode connected in series, and is connected between the gate terminal and the drain terminal of the switching circuit 13b. When the circulation path formed by the coil of the main contactor 7b and the freewheeling diode 14b is disconnected, the clamp circuit 16b clamps the voltage applied to the switching circuit 13b from the coil of the main contactor 7b to a predetermined clamp voltage Vz or less.

The control unit 11 outputs drive signals from the output terminals PWMa, PWMb, and GPIO to the gate terminals of the switching circuits 13a, 13b, and 13c via the input circuits 15a, 15b, and 15c. The on and off states of the switching circuits 13a, 13b, and 13c are controlled based on the drive signals input from the control unit 11 to the gate terminals. The control unit 11 diagnoses the disconnection states of the circulation paths based on the output voltages of the freewheeling diodes 14a and 14b measured at the input terminal ADCd. A specific diagnosis method will be described below.

Next, a control procedure of the main contactors 7a and 7b and the pre-charge relay 8 in the battery monitoring device 3 will be described. FIG. 3 is a diagram illustrating an example of a contactor control sequence from when the assembled battery 6 is connected to the inverter 2 to when the assembled battery is disconnected from the inverter 2.

As illustrated in FIG. 3, when the battery monitoring device 3 is activated at time t1, the battery monitoring device initially switches the main contactor 7b from off to on at time t2 after a dormant state. At this time, the battery monitoring device 3 controls the current flowing through the coil of the main contactor 7b by outputting a PWM drive signal having a predetermined duty from the output terminal PWMb of the control unit 11 to the gate terminal of the switching circuit 13b. That is, for a period during which the PWM drive signal is High, since the switching circuit 13b is turned on, the coil of the main contactor 7b is energized from the contactor power supply 10, and the current flowing through the coil increases. Meanwhile, for a period during which the PWM drive signal is Low, since the switching circuit 13b is turned off, the energization from the contactor power supply 10 to the coil of the main contactor 7b is canceled. At this time, an excitation current due to inductive components of the coil flows as the circulation current through the circulation path formed by the coil and the freewheeling diode 14b, and thus, the current continues to flow through the coil for a while. Through the repetition of the above-described processes, it is possible to reduce coil current consumption while maintaining the main contactor 7b in the turned-on state.

Next, the battery monitoring device 3 makes a transition to a pre-charge operation state by switching the pre-charge relay 8 from off to on at time t3. At this time, the battery monitoring device 3 changes the drive signal output from the output terminal GPIO of the control unit 11 to the gate terminal of the switching circuit 13c from Low to High, and thus, the coil of the pre-charge relay 8 is energized from the contactor power supply 10. As a result, current flows through the coil.

When the pre-charge operation state elapses for a predetermined period and the pre-charge is completed, the battery monitoring device 3 subsequently switches the main contactor 7a from off to on at time t4. At this time, as in the case of the main contactor 7b, the battery monitoring device 3 controls the current flowing through the coil of the main contactor 7a by outputting a PWM drive signal having a predetermined duty from the output terminal PWMa of the control unit 11 to the gate terminal of the switching circuit 13a. That is, for a period during which the PWM drive signal is High, since the switching circuit 13a is turned on, the coil of the main contactor 7a is energized from the contactor power supply 10, and the current flowing through the coil increases. Meanwhile, for a period during which the PWM drive signal is Low, since the switching circuit 13a is turned off, the energization from the contactor power supply 10 to the coil of the main contactor 7a is canceled. At this time, an excitation current due to inductive components of the coil flows as the circulation current through the circulation path formed by the coil and the freewheeling diode 14a, and thus, the current continues to flow through the coil for a while. Through the repetition of the above-described processes, it is possible to reduce the coil current consumption while maintaining the main contactor 7a in the turned-on state.

When the main contactor 7a is switched on, the pre-charge relay 8 is switched from on to off at time t5, and thus, the connection between the assembled battery 6 and the inverter 2 is completed. Accordingly, the battery monitoring device 3 makes a transition to a normal operation state in which the operation of the inverter 2 can be started. At this time, the battery monitoring device 3 cuts off the energization to the coil of the pre-charge relay 8 by changing the drive signal output from the output terminal GPIO of the control unit 11 to the gate terminal of the switching circuit 13c from High to Low.

When the connection between the assembled battery 6 and the inverter 2 is cancelled, the battery monitoring device 3 makes a transition to the dormant state by switching the main contactors 7a and 7b from on to off at times t6 and t7, respectively. At this time, the battery monitoring device 3 cancels the energization to the coils of the main contactors 7a and 7b by stopping outputting of the PWM drive signals to the gate terminals of the switching circuits 13a and 13b from the output terminals PWMa and PWMb of the control unit 11.

For the periods of the pre-charge operation state and the normal operation state, the battery monitoring device 3 determines whether or not a voltage Vc of the contactor power supply 10 detected at the input terminal ADCd of the control unit 11 is equal to or greater than a predetermined operation lower limit voltage necessary to normally operate the main contactors 7a and 7b and the pre-charge relay 8. As a result, when a state in which the voltage Vc of the contactor power supply 10 is less than the operation lower limit voltage is continued, all the drive signals output from the output terminals PWMa, PWMb, and GPIO of the control unit 11 to the switching circuits 13a, 13b, and 13c are set to be Low. Accordingly, the connection between the assembled battery 6 and the inverter 2 is forcibly cancelled, and thus, safety is ensured.

Next, a method for diagnosing the disconnection states of the main contactors 7a and 7b and the pre-charge relay 8 will be described.

In the circuit configuration illustrated in FIG. 2, when the contactor power supply control relay 18 is turned on, the voltage Vc of the contactor power supply 10 is input to the input terminal ADCd of the control unit 11 via the connector terminal 17d of the battery monitoring device 3 and the monitor circuit 12d. Therefore, the output voltages of the freewheeling diodes 14a and 14b detected at the input terminal ADCd of the control unit 11 at this time are equal to the voltage Vc of the contactor power supply 10.

Here, it is assumed that the connector terminal 17d of the battery monitoring device 3 has an open-circuit failure when the switching circuits 13a and 13b receive the PWM drive signals from the control unit 11 and are in the normal operation state in which the PWM control is performed. In this case, the circulation path formed by the coil of the main contactor 7a and the freewheeling diode 14a and the circulation path formed by the coil of the main contactor 7b and the freewheeling diode 14b are disconnected at the connector terminal 17d, and thus, an open circuit is formed. In this state, when at least one of the switching circuits 13a and 13b is switched from on to off, a voltage higher than a voltage at a normal time is applied to the drain terminal of the switching circuit by an induced electromotive force generated by the coil of the contactor of the main contactors 7a and 7b which corresponds to the switching circuit. The voltage of the drain terminal of the switching circuit is clamped to the clamp voltage Vz or less by the switching circuit and one of the clamp circuits 16a and 16b which is connected to the switching circuit.

In the above-described state, in the control unit 11, a voltage obtained by subtracting a voltage drop of the freewheeling diode 14a or 14b from the clamp voltage Vz is detected at the input terminal ADCd until the applied voltage due to the self-induced electromotive force of the coil becomes the clamp voltage Vz or less. Therefore, when the switched-on and -off of the switching circuits 13a and 13b are repeated by PWM control, the output voltages of the freewheeling diodes 14a and 14b detected at the input terminal ADCd are maintained near the substantially constant clamp voltage Vz. At this time, the switching circuits 13a and 13b and the clamp circuits 16a and 16b operate as sample-hold circuits for the output voltages of the freewheeling diodes 14a and 14b.

As described above, when the circulation path is disconnected while the switching circuits 13a and 13b are PWM-controlled, a voltage corresponding to the clamp voltage Vz is detected at the input terminal ADCd of the control unit 11. Therefore, when the clamp voltage Vz is set to a sufficiently higher voltage than the output voltages of the freewheeling diodes 14a and 14b measured during non-disconnection, that is, the voltage Vc of the contactor power supply 10, the control unit 11 can detect the disconnection of the circulation path by monitoring the voltage detected at the input terminal ADCd.

Although the normal operation state in which the switching circuits 13a and 13b are PWM-controlled has been described, when at least one of the switching circuits 13a and 13b is PWM-controlled, it is possible to detect the disconnection of the circulation path by the similar method. That is, for a pre-charge period during which only the switching circuit 7b connected to the coil of the main contactor 7b is PWM-controlled or in a case where one of the switching circuits 13a and 13b is constantly turned on (duty 100%) or is constantly turned off (duty 0%), when the connector terminal 17d of the battery monitoring device 3 has an open-circuit failure, it is possible to detect the disconnection of the circulation path by the similar method.

The above-described detection of the disconnection of the circulation path will be described in more detail with reference to FIG. 4. FIG. 4 is a diagram illustrating an example of a detection voltage and a drive signal of the control unit 11 when the disconnection of the circulation path occurs.

In a case where the disconnection does not occur at any of the circulation path formed by the coil of the main contactor 7a and the freewheeling diode 14a and the circulation path formed by the coil of the main contactor 7b and the freewheeling diode 14b, when the contactor power supply control relay 18 is turned on, the voltage Vc of the contactor power supply 10 is detected at the input terminal ADCd of the control unit 11. Subsequently, the control unit 11 outputs the PWM drive signals to the switching circuits 13a and 13b, as control signals of the main contactors 7a and 7b. Accordingly, the switching circuits 13a and 13b are PWM-controlled. Even in this state, the voltage Vc of the contactor power supply 10 is detected at the input terminal ADCd of the control unit 11.

Here, at time t11, the connector terminal 17d of the battery monitoring device 3 has an open-circuit failure, and thus, the disconnection occurs at the circulation path formed by the coil of the main contactor 7a and the freewheeling diode 14a and the circulation path formed by the coil of the main contactor 7b and the freewheeling diode 14b. At this time, the voltage detected at the input terminal ADCd of the control unit 11 rises to the clamp voltage Vz higher than the voltage Vc of the contactor power supply 10, as illustrated in FIG. 4. This is because the voltages of the drain terminals are clamped to the clamp voltage Vz and are detected via the freewheeling diodes 14a and 14b due to the application of the high voltage to the drain terminals of the switching circuits 13a and 13b due to the induced electromotive force generated by the coils of the main contactors 7a and 7b, as already described above.

The control unit 11 detects the disconnection of the circulation path by detecting a rise in the detection voltage at the input terminal ADCd as described above. When the disconnection of the circulation path is detected, at time t12, the control unit 11 changes the duties of the PWM drive signals output from the output terminals PWMa and PWMb to the switching circuits 13a and 13b from a value which is less than 100% which is a value for PWM control in the normal operation state to 100%. That is, the switching states of the switching circuits 13a and 13b are switched from PWM control to a constantly turned-on state with a duty of 100%. As a result, even when the circulation path is disconnected and the circulation current does not flow through the coils of the main contactors 7a and 7b, it is possible to prevent a time average level of the currents flowing through the coils from being lower than the voltage at the normal time, and thus, it is possible to maintain the switching state of each contactor in a normally turned-on state. As a result, it is possible to prevent welding due to a decrease in a contact force of each contactor caused by the disconnection of the circulation path.

When the switching circuits 13a and 13b are switched to the constantly turned-on state at time t12, the voltage detected at the input terminal ADCd of the control unit 11 gradually decreases from the clamp voltage Vz to 0V (Low), as illustrated in FIG. 4. This is because the switching circuits 13a and 13b are in the constantly turned-on state, and thus, the voltages of the drain terminals of the switching circuits 13a and 13b are equal to the potential of the grounded source terminal. Therefore, when the switching circuits 13a and 13b are in the constantly turned-on state, in a case where the detection voltage at the input terminal ADCd is changed to 0 V, the control unit 11 can detect the disconnection of the circulation path.

Thereafter, at time t13, the control unit 11 stops outputting the drive signals from the output terminals PWMa and PWMb to the switching circuits 13a and 13b in order to cancel the connection between the assembled battery 6 and the inverter 2. By doing this, the voltage detected at the input terminal ADCd of the control unit 11 is a voltage lower than the voltage Vc of the contactor power supply 10 by a voltage drop amount Vf at the freewheeling diodes 14a and 14b as illustrated in FIG. 4. This is because the switching circuits 13a and 13b are in a constantly turned-off state and thus, the voltages at the drain terminals of the switching circuits 13a and 13b are equal to the voltage Vc of the contactor power supply 10 connected via the coils of the main contactors 7a and 7b. Therefore, when the switching circuits 13a and 13b are in the constantly turned-off state, in a case where the detection voltage at the input terminal ADCd is changed to the voltage lower than the voltage Vc of the contactor power supply 10 by the voltage drop amount Vf, the control unit 11 can detect the disconnection of the circulation path.

In the above-described case, the change in the detection voltage when the switching circuits 13a and 13b are in the constantly turned-off state is detected may be easily detected by increasing the voltage drop amount at the input terminal ADCd with respect to the drain terminal voltages of the switching circuits 13a and 13b. For example, the freewheeling diodes 14a and 14b may include a plurality of diodes connected in series, or may include resistors and Zener diodes inserted in series for the freewheeling diodes 14a and 14b. Accordingly, it is possible to realize more reliable detection of the disconnection of the circulation path in consideration of variations in element characteristics of the monitor circuit 12d.

Although it has been described that when the disconnection of the circulation path is detected, the duties of the PWM drive signals output from the output terminals PWMa and PWMb of the control unit 11 to the switching circuits 13a and 13b are changed to 100%, the changed duty of the PWM drive signals is not necessarily 100%. As long as the welding can be prevented by maintaining the switching state of each contactor in the normally turned-on state, it is possible to set the changed duties of the PWM drive signals to any value.

When the circulation path is disconnected, the voltage Vc of the contactor power supply 10 may be measured based on the terminal voltages of the coils of the main contactors 7a and 7b and the pre-charge relay 8 detected at the input terminals ADCa, ADCb, and ADCc of the control unit 11. That is, when the connector terminal 17d of the battery monitoring device 3 has an open-circuit failure and thus, the circulation path is disconnected, the voltage Vc of the contactor power supply 10 cannot be detected at the input terminal ADCd of the control unit 11. Therefore, in such a case, the terminal voltage of the coil which is connected to one of the switching circuits 13a, 13b, and 13c which is in the turned-off state is measured by using any one of the input terminals ADCa, ADCb, and ADCc instead of the input terminal ADCd. Accordingly, it is preferable that the voltage Vc of the contactor power supply 10 connected via the coil is measured.

Specifically, in a period from time t1 to time t2 in FIG. 3 and a period after time t7, the battery monitoring device 3 is in the dormant state, and the switching circuits 13a, 13b, and 13c are all in the turned-off state. Thus, in these periods, the voltage Vc of the contactor power supply 10 can be measured by using the measurement result at any of the input terminals ADCa, ADCb, and ADCc of the control unit 11. Meanwhile, in a period from time t3 to time t4 in FIG. 3, the battery monitoring device 3 is in the pre-charge state, and only the switching circuit 13a corresponding to the main contactor 7a is in the turned-off state. Thus, in this period, the voltage Vc of the contactor power supply 10 can be measured by using the measurement result at the input terminal ADCa of the control unit 11. In a period from time t5 to time t6 in FIG. 3, the battery monitoring device 3 is in the normal operation state, and only the switching circuit 13c corresponding to the pre-charge relay 8 is in the turned-off state. Thus, in this period, the voltage Vc of the contactor power supply 10 can be measured by using the measurement result at the input terminal ADCc of the control unit 11.

As described above, even when the circulation path is disconnected, the control unit 11 can measure the voltage Vc of the contactor power supply 10. As a result, as in the case where the above-described disconnection does not occur, when a state in which the obtained voltage Vc of the contactor power supply 10 is less than the operation lower limit voltage is continued, all the drive signals output from the output terminals PWMa, PWMb, and the GPIO of the control unit 11 to the switching circuits 13a, 13b, and 13c are set to be Low. Accordingly, the connection between the assembled battery 6 and the inverter 2 is forcibly cancelled, and thus, safety is ensured.

According to the above-described embodiment of the present invention, the following effects can be obtained.

(1) The battery monitoring device 3 in the battery drive system functions as the load control device that controls the coils of the main contactors 7a and 7b and the pre-charge relay 8 which are inductive loads. The battery monitoring device 3 includes the switching circuits 13a and 13b that control the currents flowing through the coils by being controlled to be turned on and off, freewheeling diodes 14a and 14b that are connected to the coils to form circulation paths for returning the currents, and a control unit 11. The control unit 11 functions as a first voltage measurement unit that measures the output voltages of the freewheeling diodes 14a and 14b at the input terminal ADCd, and detects the disconnection of the circulation paths based on the measured output voltages of the freewheeling diodes 14a and 14b. By doing this, even though the monitor circuit having the peak-hold function in order to measure the terminal voltage of the coil is not provided, the disconnection detection of the circulation path can be realized. Therefore, it is possible to detect the disconnection of the circulation path through which the circulation current flows while suppressing the increase in circuit scale.

(2) The battery monitoring device 3 includes the switching circuits (switching circuits 13a and 13b) and the freewheeling diodes (freewheeling diodes 14a and 14b) for the coils of the main contactors 7a and 7b. The outputs of the freewheeling diodes 14a and 14b are electrically connected to each other at a predetermined connection point. The control unit 11 measures the output voltages of the freewheeling diodes 14a and 14b by measuring the voltages at this connection point. By doing this, even though the plurality of coils is connected as the inductive loads, it is possible to detect the disconnection of the circulation path by measuring the voltages at one connection point. Therefore, it is possible to further suppress the circuit scale.

(3) The battery monitoring device 3 further includes the clamp circuits 16a and 16b that clamp the voltages applied from the coils to the switching circuits 13a and 13b to the predetermined clamp voltage Vz or less. The clamp circuits 16a and 16b are respectively connected to the input sides of the freewheeling diodes 14a and 14b, and the clamp voltage Vz is a voltage higher than the output voltage of the freewheeling diode measured by the control unit 11 when the circulation path is not disconnected. By doing this, when the disconnection occurs in the circulation path, excessive voltages applied from the coils to the switching circuits 13a and 13b are alleviated, and the output voltages of the freewheeling diodes 14a and 14b measured by the control unit 11 can be maintained at a substantially constant value.

(4) Each of the switching circuits 13a and 13b includes the gate terminal to which the drive signal for controlling on and off of the switching circuit is input, and the drain terminal to which the coils and the freewheeling diodes 14a and 14b are connected. The clamp circuits 16a and 16b are connected between the gate terminals and the drain terminals of the switching circuits 13a and 13b, respectively. By doing this, when the disconnection occurs in the circulation path and the excessive voltages are applied from the coils to the drain terminals of the switching circuits 13a and 13b, it is possible to protect the drain terminals by automatically switching the switching circuits 13a and 13b from off to on.

(5) In the battery monitoring device 3, the control unit 11 further functions as a second voltage measurement unit that measures the terminal voltages of the coils of the main contactors 7a and 7b and the pre-charge relay 8 at the input terminals ADCa, ADCb, and ADCc, respectively. By doing this, even when the circulation path is disconnected, the voltage Vc of the contactor power supply 10 can be measured by the control unit 11.

(6) The control unit 11 outputs the drive signals for controlling on and off of the switching circuits 13a and 13b to the switching circuits 13a and 13b, respectively, and changes the drive signals when the disconnection of the circulation path is detected. Specifically, the control unit 11 outputs, as the drive signals, the PWM signals for PWM control of the switching circuits 13a and 13b. When the disconnection of the circulation path is detected, the control unit 11 changes the duty of the PWM signal. By doing this, even when the circulation path is disconnected and the circulation current does not flow through the coils of the main contactors 7a and 7b, it is possible to prevent the time average level of the currents flowing through the coils from being lower than the voltage at the normal time. As a result, the switching state of each contactor can be maintained in the normally turned-on state.

(7) The control unit 11 has the battery monitoring function of monitoring the assembled battery 6 that supplies the power to the operating system including the motor 1 and the inverter 2 in addition to the load control function of controlling the coils of the main contactors 7a and 7b and the pre-charge relay 8. By doing this, it is possible to realize both the load control function and the battery monitoring function by one device, and it is possible to achieve size reduction and cost reduction of the whole system.

Although it has been described in the aforementioned embodiment that the coils of the main contactors 7a and 7b and the pre-charge relay 8 are controlled as the inductive loads, the present invention is not limited thereto, and other types of loads can also be applied. As long as the inductive load in which the circulation path is formed is controlled and the disconnection of the circulation path is detected, the present invention can be applied by the same method as the above-described embodiment.

The above-described embodiment and various modification examples are merely examples, and the present invention is not limited to these contents as long as the features of the invention are not impaired. Although various embodiments and modification examples have been described above, the present invention is not limited to these contents. Other embodiments considered within the scope of the technical idea of the present invention are also included within the scope of the present invention.

REFERENCE SIGNS LIST 1 motor
2 inverter
3 battery monitoring device
4 battery cell
5 battery module
6 assembled battery
7a, 7b main contactor
8 pre-charge relay
9 pre-charge resistor
10 contactor power supply
11 control unit
12a, 12b, 12c, 12d monitor circuit
13a, 13b, 13c switching circuit
14a, 14b freewheeling diode
15a, 15b, 15c input circuit
16a, 16b clamp circuit
17a, 17b, 17c, 17d connector terminal
18 contactor power supply control relay

The invention claimed is:

1. A load control device comprising:
a switching circuit that controls a current flowing through an inductive load by being controlled to be turned on and off;
a freewheeling diode that is connected to the load to form a circulation path for circulating the current;
a first voltage measurement unit that measures an output voltage of the freewheeling diode;
a control unit that detects disconnection of the circulation path based on the output voltage of the freewheeling diode measured by the first voltage measurement unit,
a clamp circuit that clamps a voltage applied to the switching circuit from the load to a predetermined clamp voltage or less, wherein
the clamp circuit is connected to an input side of the freewheeling diode,
the clamp voltage is a voltage higher than the output voltage of the freewheeling diode measured by the first voltage measurement unit when the circulation pass is not disconnected,
the switching circuit includes a first terminal to which a drive signal for controlling on and off of the switching circuit is input and a second terminal to which the load and the freewheeling diode are connected, and
the clamp circuit is connected between the first terminal and the second terminal.

2. The load control device according to claim 1, wherein
the switching circuit and the freewheeling diode are provided for each of a plurality of the loads,
outputs of a plurality of the freewheeling diodes are electrically connected to each other at a predetermined connection point, and
the first voltage measurement unit measures output voltages of the plurality of freewheeling diodes by measuring voltages at the connection point.

3. The load control device according to claim 1, further comprising a second voltage measurement unit that measures a terminal voltage of the load.

4. The load control device according to claim 1, wherein
the control unit outputs, to the switching circuit, a drive signal for controlling the on and off of the switching circuit, and
when the disconnection of the circulation path is detected, the control unit changes the drive signal.

5. The load control device according to claim 4, wherein
the control unit outputs, as the drive signal, a PWM signal for performing PWM control of the switching circuit, and
when the disconnection of the circulation path is detected, the control unit changes a duty of the PWM signal.

6. The load control device according to claim 1, wherein
the load is a coil that changes a switching state of a contactor for connecting a battery to an operating system that operates by using a power supplied from the battery, and
the control unit has a battery monitoring function of monitoring the battery.

* * * * *